(12) United States Patent
Wang et al.

(10) Patent No.: US 7,826,227 B2
(45) Date of Patent: Nov. 2, 2010

(54) HEAT DISSIPATION DEVICE

(75) Inventors: Feng-Ku Wang, Taipei (TW);
 Shaw-Fuu Wang, Taipei (TW);
 Ting-Chiang Huang, Taipei (TW);
 Sheng-Jie Syu, Taipei (TW)

(73) Assignee: Inventec Corporation, Taipei (TW)

( * ) Notice: Subject to any disclaimer, the term of this patent is extended or adjusted under 35 U.S.C. 154(b) by 0 days.

(21) Appl. No.: 12/068,909

(22) Filed: Feb. 13, 2008

(65) Prior Publication Data
 US 2009/0201647 A1 Aug. 13, 2009

(51) Int. Cl.
 *H01L 23/34* (2006.01)
 *F28F 7/00* (2006.01)

(52) U.S. Cl. .................. 361/703; 165/80.2; 165/80.3; 165/185; 257/712; 257/713; 361/704; 361/710; 361/717; 361/718; 361/722

(58) Field of Classification Search ............... None
 See application file for complete search history.

(56) References Cited

U.S. PATENT DOCUMENTS

| | | | | |
|---|---|---|---|---|
| 4,485,429 A | * | 11/1984 | Mittal | 361/718 |
| 5,852,548 A | * | 12/1998 | Koon et al. | 361/704 |
| 6,223,814 B1 | * | 5/2001 | Moresco et al. | 165/185 |
| 7,144,624 B2 | * | 12/2006 | Knowles et al. | 428/364 |
| 2009/0034197 A1 | * | 2/2009 | Leija et al. | 361/703 |
| 2009/0205807 A1 | * | 8/2009 | Kim et al. | 165/80.3 |

* cited by examiner

*Primary Examiner*—Gregory D Thompson
(74) *Attorney, Agent, or Firm*—Morris Manning Martin LLP; Tim Tingkang Xia, Esq.

(57) ABSTRACT

A heat dissipation device is disposed in an electronic device and performs thermal exchange with an electronic component of the electronic device. The heat dissipation device includes a heat sink and a plurality of fluttering slices. The heat sink is attached on the electronic component to conduct the thermal energy of the electronic component. The fluttering slices are disposed on the heat sink, and the fluttering slices are actuated to generate an airflow when the electronic device is moved, so as to disturb the air inside the electronic device, thereby achieving the purpose of improving the thermal dissipation performance.

6 Claims, 8 Drawing Sheets

HEAT DISSIPATION DEVICE

BACKGROUND OF THE INVENTION

1. Field of Invention

The present invention relates to a heat dissipation device, and more particularly to a heat dissipation device applied to a portable electronic device.

2. Related Art

Currently, with the rapid development of electronic technology, and more attention of consumers on the features of being light, thin and mobile of consumer electronic products, today's electronic products, for example, portable electronic devices such as notebooks, ultra mobile personal computers (UMPCs) and PDAs, are developed towards miniaturization gradually. As for users that often need to go outside, the portable electronic products become easier to carry, thus the convenience in use is improved significantly.

As the operation speed of electronic components inside a computer device is accelerated, and the volumes of the electronic components are micro, the thermal energy produced per unit area is increased accordingly. If the thermal energy cannot be dissipated in time, excessively high temperature will have severe impacts on the stability and efficiency of the electronic components upon operating, and even will cause short working life of the computer or damage the computer device.

For current small portable electronic devices, such as flat panel computer and UMPC, in order to meet the requirements for being thin, light and mobile of consumers when choosing and purchasing this type of small computer devices, it is difficult to install an additional heatsink fan in the portable computer device with limited free space. Therefore, the portable computer device without a fan design lacks of forced convection of the air, and the thermal energy is dissipated merely by natural convection and thermal radiation between a heat sink and the air, thus the thermal dissipation efficiency is poor and cannot meet the thermal dissipation requirements of the current portable electronic devices with high operating speed.

In order to solve the heatsink device problem inside the portable computer devices, conventional methods include reducing the operating frequency of electronic components, such as a central processing unit (CPU), so as to avoid generating excessive thermal energy; or, increasing the area of thermal dissipation surface of the computer device, such that the thermal energy generated by the electronic components is removed from the interior of the computer device by a large thermal dissipation surface.

Although reducing the operating frequency of the electronic components can reduce the thermal energy generated by the portable computer device during operation, the overall performance of the computer device is affected accordingly, and thus the requirement of consumers for high operating performance on the electronic products cannot be satisfied. Furthermore, the electronic device dissipates thermal energy merely by natural convection and thermal radiation, the thermal dissipation effect is still insufficient.

For the thermal dissipating manner of increasing the area of the thermal dissipation surface, the overall volume of the computer will be increased with the increase of the surface area, thus the portable computer device cannot be miniaturized, which is contrary to the trend that the electronic products available in the market must be light, thin, short, and small.

SUMMARY OF THE INVENTION

In view of the above problems, the present invention is to provide a heat dissipation device, which can solve the problem that a conventional heat dissipation device applied to a portable electronic device must be wired according to an internal circuit and cannot dissipate thermal energy by a fan, and thermal energy is merely dissipated in a natural convection mode through the contact of the surface of a heat sink and the air, thereby leading to poor overall thermal dissipation performance.

The heat dissipation device of the present invention is disposed in an electronic device to perform thermal exchange with an electronic component of an electronic device. The heat dissipation device includes a heat sink and a plurality of fluttering slices. A side of the heat sink is attached on the electronic component to conduct the thermal energy of the electronic component. The fluttering slices are disposed on the heat sink, when the electronic device is moved, the fluttering slices are actuated to swing, so as to disturb the air inside the electronic device.

In the present invention, through displacement, such as incline or swing, generated when operating the electronic device, the fluttering slices are actuated to swing, thus generating an airflow to disturb the air inside the electronic device and improve the thermal cycling performance, thereby rapidly dissipating the thermal energy generated by the electronic component.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below for illustration only, and thus are not limitative of the present invention, and wherein.

DETAILED DESCRIPTION OF THE INVENTION

The heat dissipation device of the present invention is used to dissipate the thermal energy generated by an electronic device which likes a potable computer device, such as an ultra mobile personal computer (UMPC), a personal computer, a notebook computer, and a PDA, but not limit to the above-mentioned computer devices. In the detailed illustration of the present invention hereinafter, UMPC is taken as the most preferred embodiment of the present invention. However, the accompanying drawings are only used to provide reference and illustration, and are not used to limit the present invention.

Figure 1:
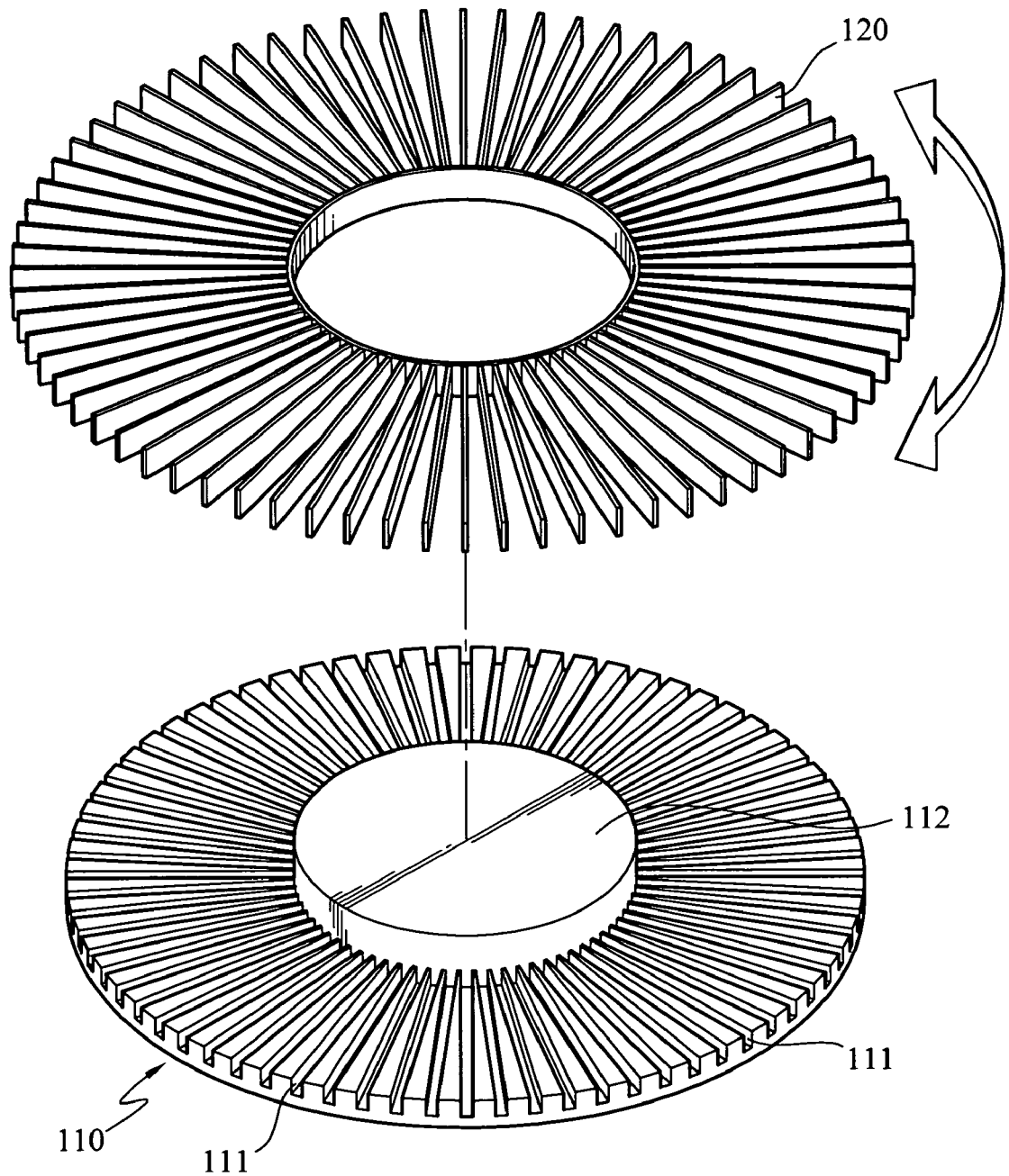
FIG. 1 is an exploded view of a first embodiment of the present invention.
Figure 2:
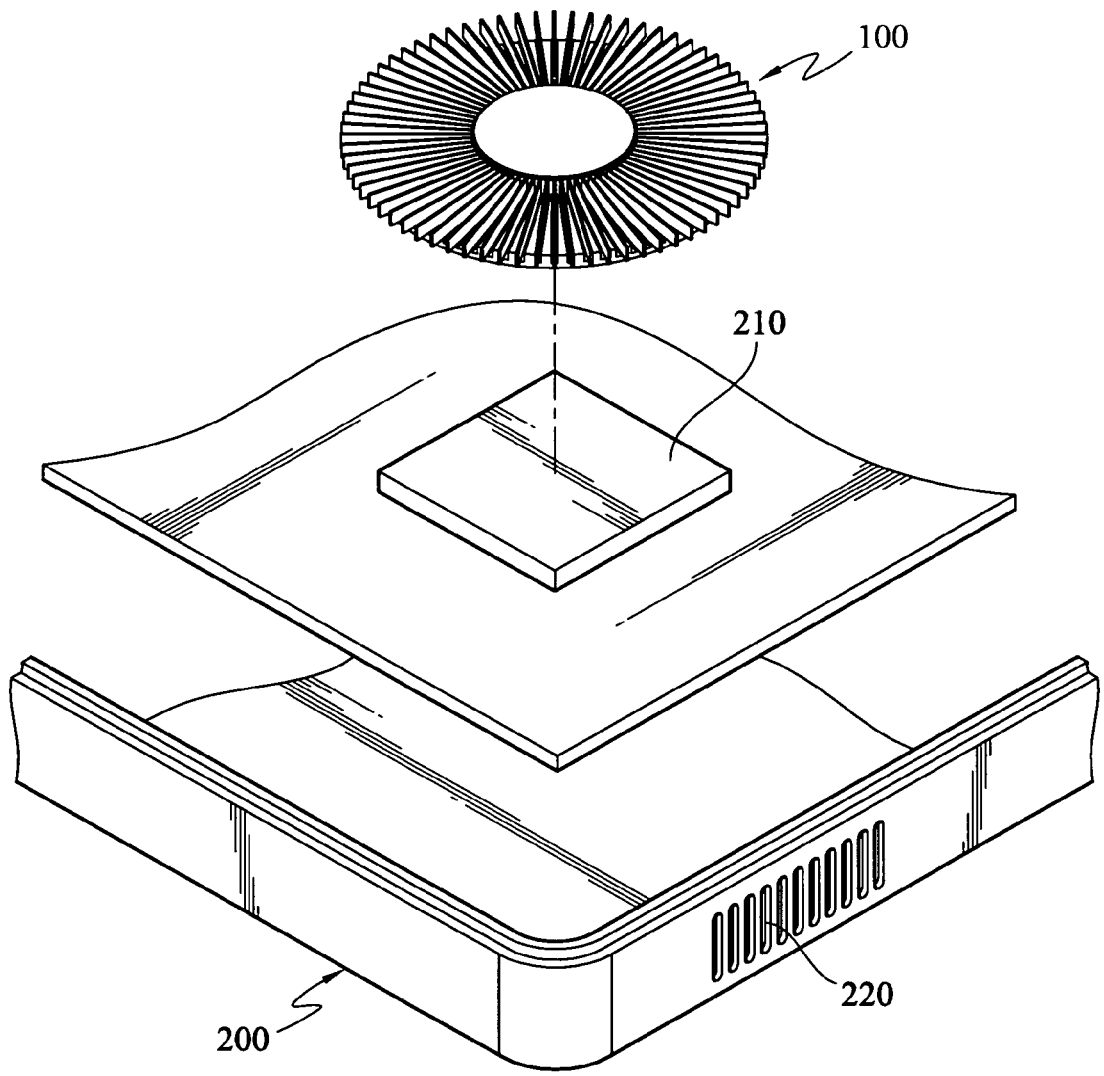
FIG. 2 is a perspective view of the first embodiment of the present invention.
Figure 3:
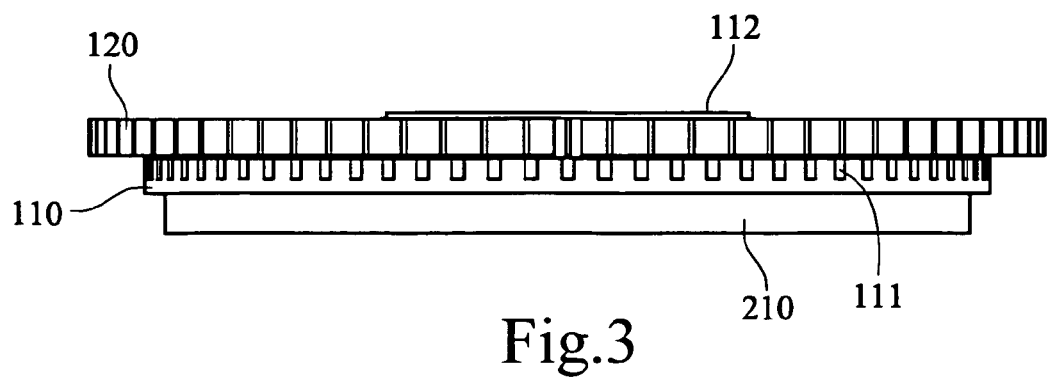
FIG. 3 is a side view of the first embodiment of the present invention.

Referring to FIGS. 1 to 3, a first embodiment of the present invention is shown. A heat dissipation device 100 of the present invention is disposed in an electronic device 200 to perform thermal exchange with an electronic component 210 in the electronic device 200. The electronic component 210 can be an electronic part or component that generates large thermal energy during operation, such as a chip and a CPU.

The heat dissipation device 100 of the first embodiment of the present invention includes a heat sink 110 and a plurality of fluttering slices 120. The heat sink 110 is of a disc structure. One side of the heat sink 110 is attached on the electronic component 210 to conduct the thermal energy generated by the electronic component 210. A plurality of grooves 111 is opened at the other side of the heat sink 110, and a cylindrical combination block 112 is protruded at the center. The fluttering slices 120 are made of a metal sheet or a flexible material, such that the fluttering slices 120 can swing easily and repeatedly. The plurality of fluttering slices 120 are combined to form a hollow annular structure, and are sleeved on the combination block 112. The fluttering slices 120 are arranged around the combination block 112, and the arrangement direction of the grooves 111 is corresponding to that of the fluttering slices 120.

Please refer to FIGS. 1 to 3, during operating the portable electronic device 200, users are likely to manipulate the electronic device 200 by holding with a hand. However, hand-held manipulation is not as stable as manipulating by placing on a plane, thus leading to movements of the electronic device 200, such as slight vibration or slight shock. The fluttering slices 120 located inside the electronic device 200 swing with the movement of the electronic device 200 to generate an airflow to disturb the air inside, so as to perform thermal exchange with the outside air through vents 220 of the electronic device 200, thereby improving the thermal cycling performance inside the electronic device 260. However, the disturbance airflow can also perform thermal exchange through preset holes on the case of the electronic device 200, such as seams, speaker holes, and electrically connection holes.

Furthermore, the groove 111 of the heat sink 110 is designed to increase the contact area between the airflow and the heat sink 110 when the fluttering slices 120 generate the disturbance airflow, so as to rapidly dissipate the thermal energy transferred to the heat sink 110.

Figure 4:
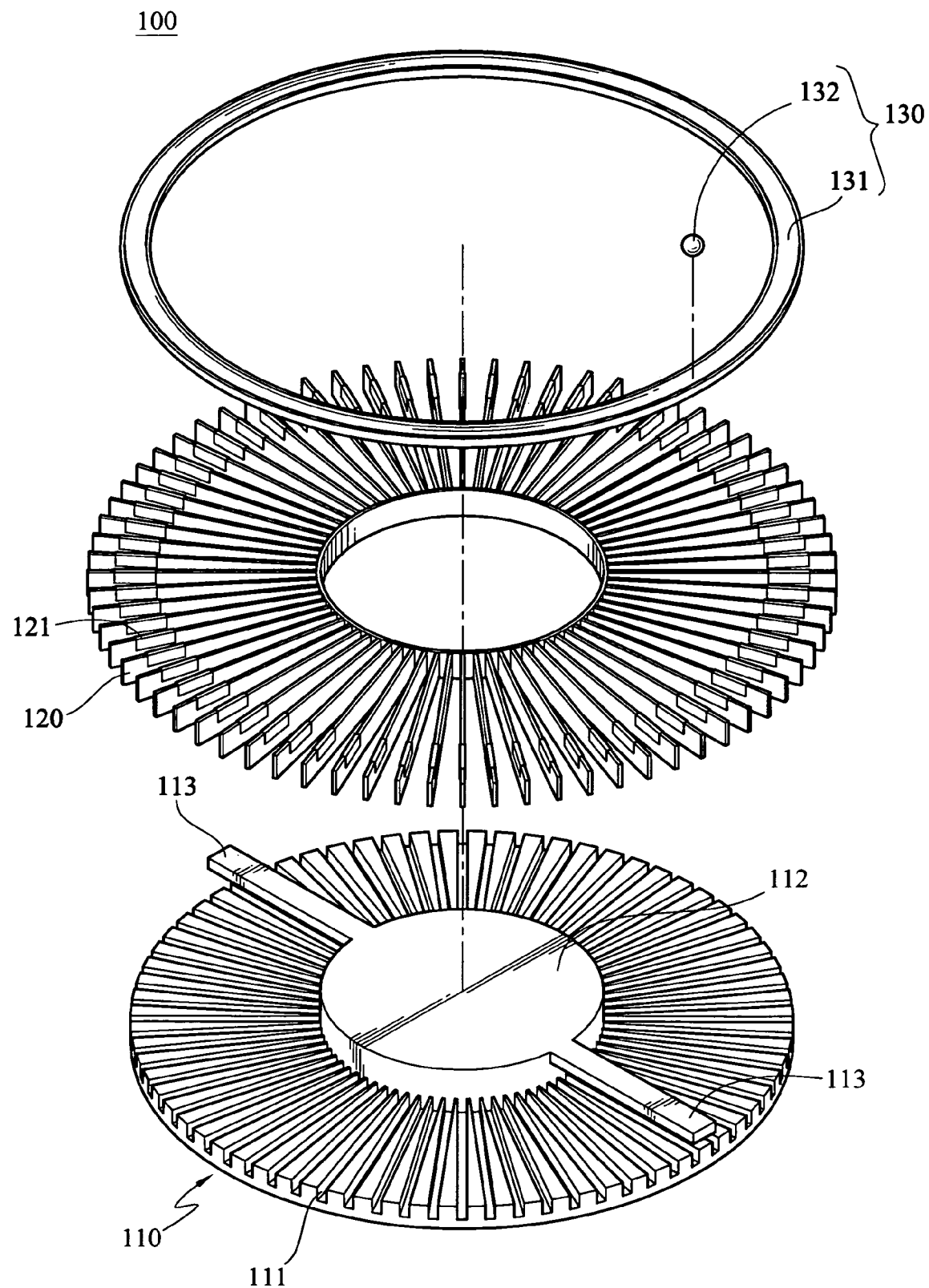
FIG. 4 is an exploded view of a second embodiment of the present invention.
Figure 5:
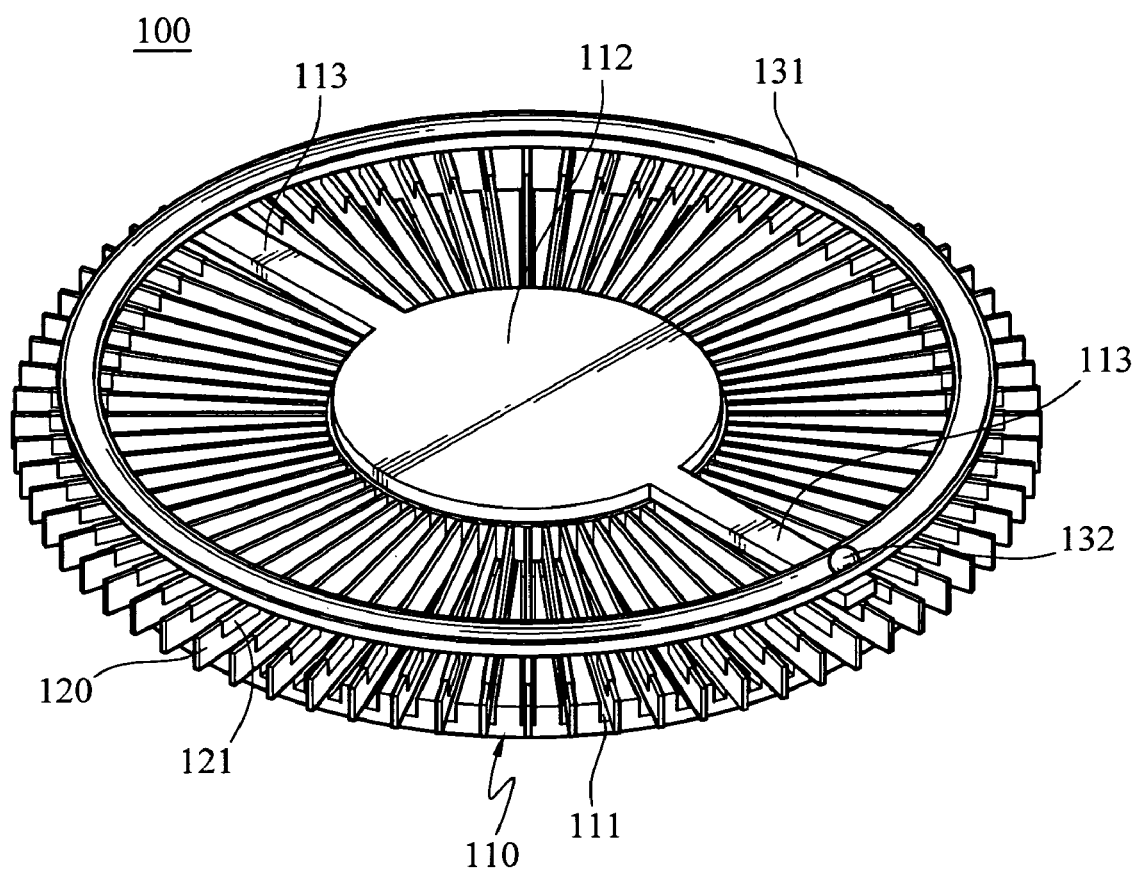
FIG. 5 is a perspective view of the second embodiment of the present invention.

FIGS. 4 and 5 show schematic views of a second embodiment of the present invention. A heat dissipation device 100 of the second embodiment of the present invention further includes an actuating member 130, which has a track 131 and a ball 132. The combination block 112 of the heat sink 110 has two opposite spanning portions 113 extending at periphery thereof. The fluttering slices 120 are disposed around the combination block 112. The track 131 is spanned on the two spanning portions 113, so as to surround and be suspended above the periphery of the fluttering slices 120. Each fluttering slice 120 has a magnetic material 121 disposed at a position corresponding to the track 131. The magnetic material 121 can be selected from ferromagnetic metallic materials having magnetism, such that the fluttering slices 120 have the material characteristics of magnetism and flexible deformation.

The ball 132 is made of a magnetic material and can roll freely in the track 131. The ball 132 and the magnetic material 121 have the same polarity, such that when the ball 132 rolls due to the movement of the electronic device 200, a repulsive magnetic field is generated between the ball 132 and the magnetic material 121 at the corresponding position, so as to assist actuating the fluttering slices 120 to swing more effectively with a higher frequency, thus improving the thermal cycling performance. For the actuating member 130 of the present invention, the number of the balls 132 can be increased or reduced according to actual requirements and is not limited by this embodiment.

Figure 6:
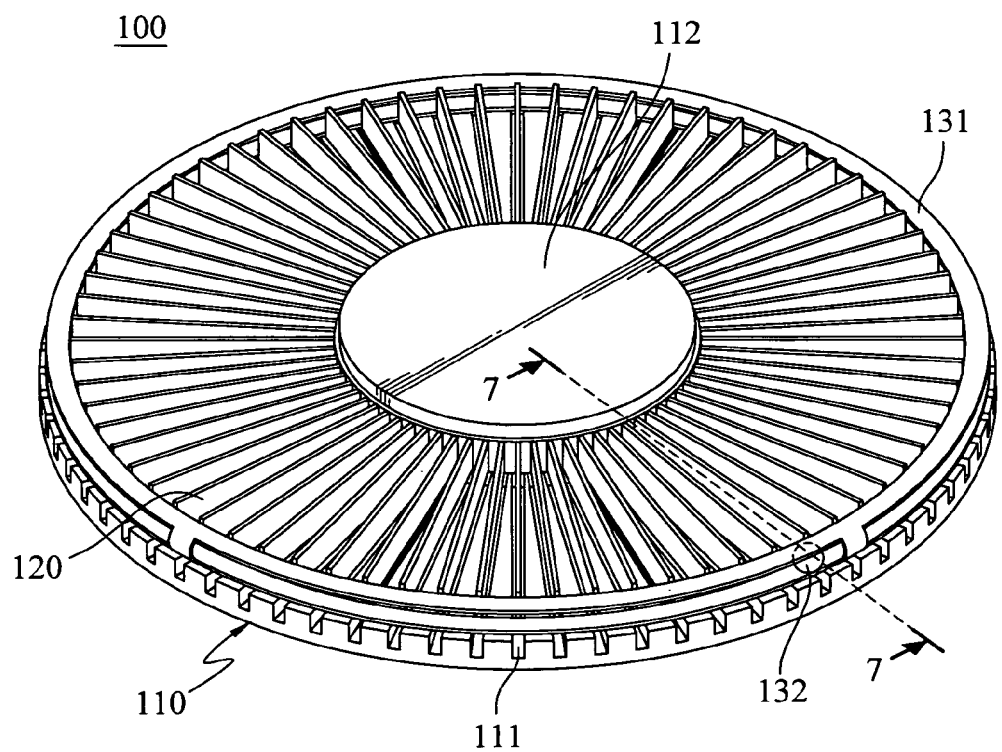
FIG. 6 is a perspective view of a third embodiment of the present invention.
Figure 7:
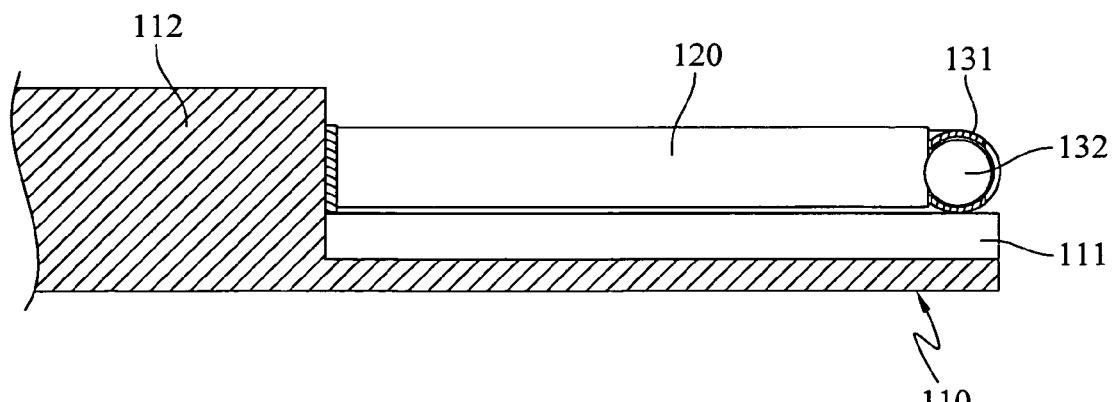
FIG. 7 is a cross-sectional side view of the third embodiment of the present invention.

FIGS. 6 and 7 show schematic views of a third embodiment of the present invention. The actuating member 130 of the present invention can further actuate the fluttering slices 120 to swing in a contact manner. The track 131 of the third embodiment is adjacent to a peripheral edge of each fluttering slice 120. The spherical surface of the ball 132 disposed in the track 131 is slightly projecting from the track 131. When rolling in the track 131, the ball 132 flaps the fluttering slices 120 at the corresponding position to swing, so as to assist actuating the fluttering slices 120 to swing more effectively with a higher frequency.

Figure 8:
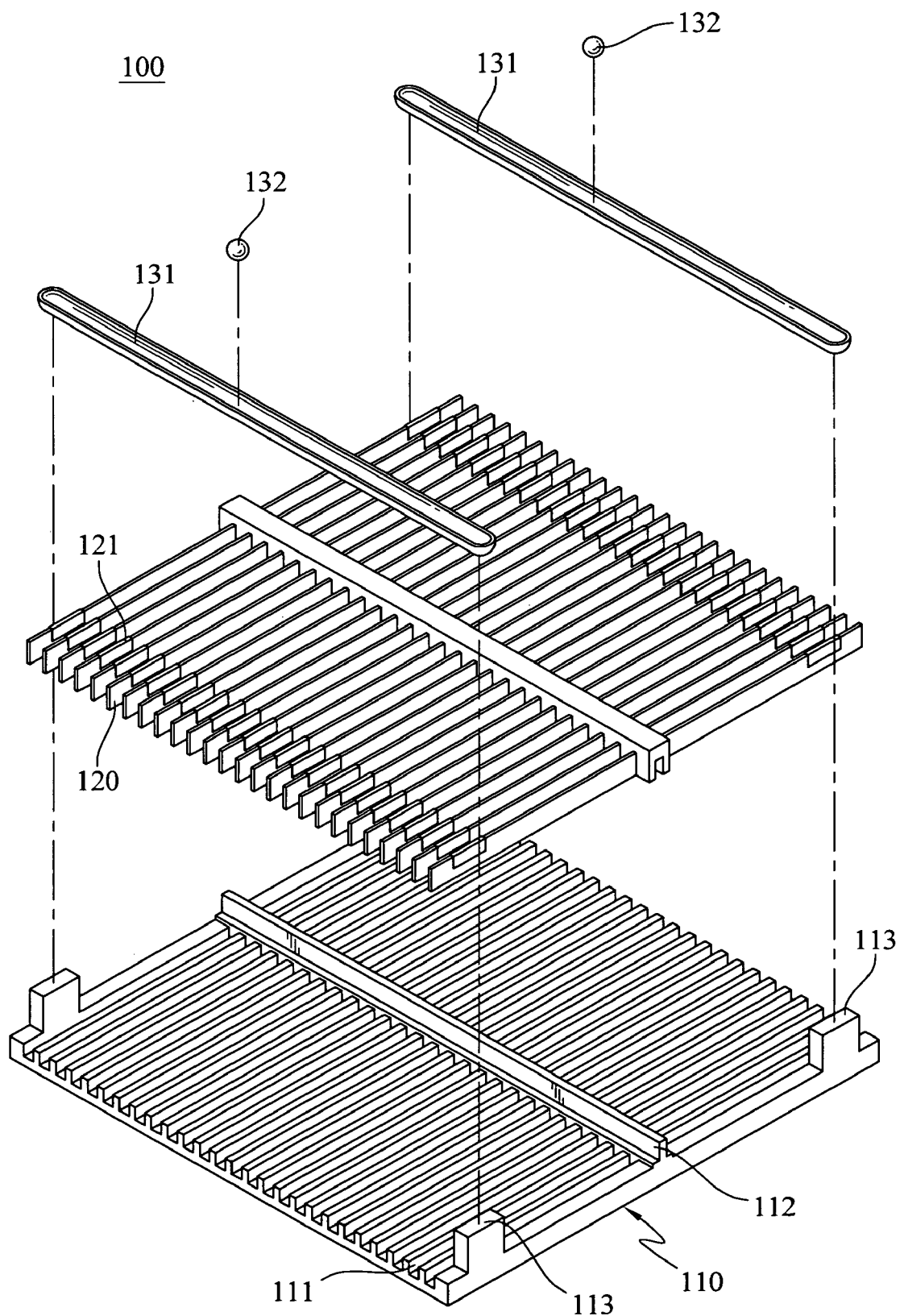
FIG. 8 is an exploded view of a fourth embodiment of the present invention.
Figure 9:
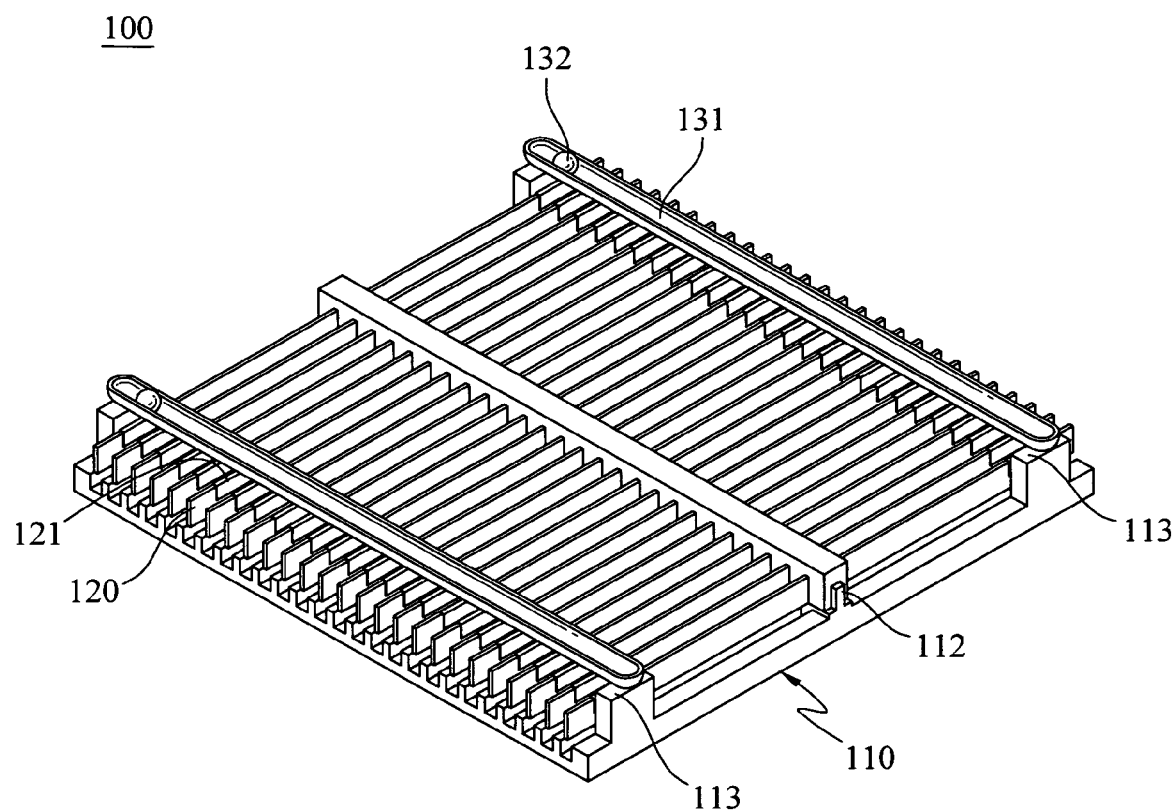
FIG. 9 is a perspective view of the fourth embodiment of the present invention.

FIGS. 8 and 9 show schematic views of a fourth embodiment of the present invention. In addition to the circular structure disclosed in the previous embodiments, the heat sink 100 of the present invention can further be designed to have a square structure according to actual thermal dissipation requirement. The plurality of fluttering slices 120 is arranged on the heat sink 110 at a certain interval. Two tracks 131 are respectively disposed on the fluttering slices 120 in a direction perpendicular to the arrangement direction of the fluttering slices 120. Each fluttering slice 120 has a magnetic material 121 disposed at a position corresponding to the track 131. The ball 132 made of a magnetic material assists actuating the fluttering slices 120 to swing by the magnetic force.

Figure 10:
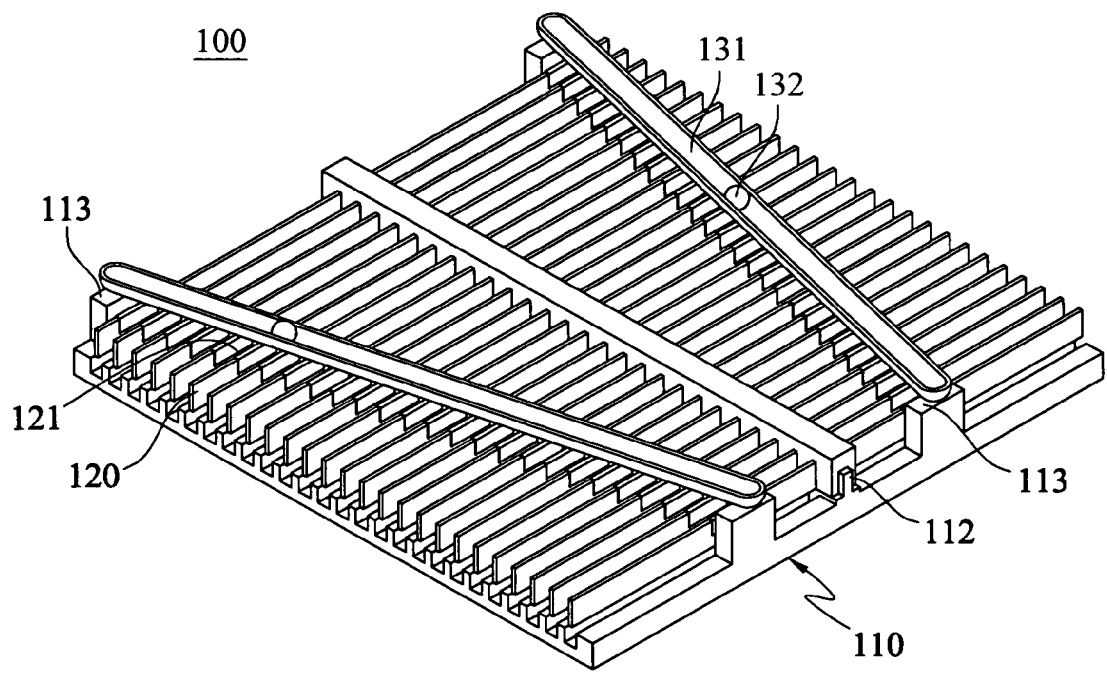
FIG. 10 is a perspective view of a fifth embodiment of the present invention.
Figure 11:
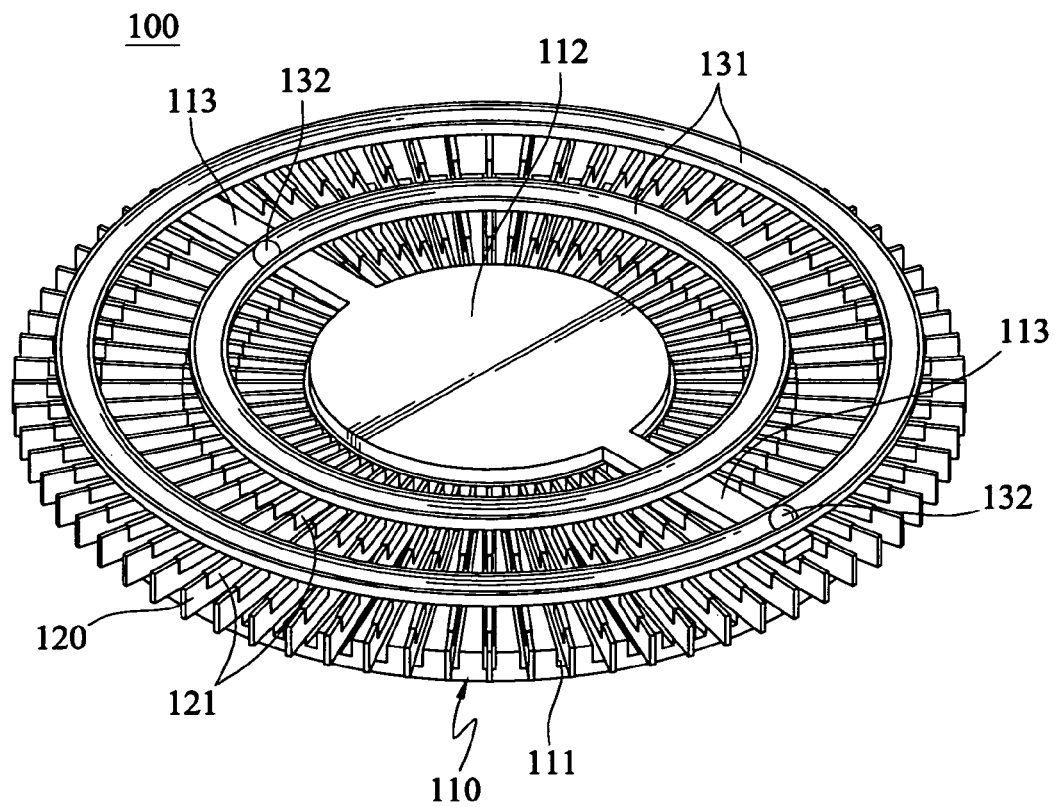
FIG. 11 is a perspective view of a sixth embodiment of the present invention.

According to the present invention, the arrangement position and the number of the track 131 can be changed correspondingly according to the thermal dissipation requirements of different types of electronic device 200. FIGS. 10 and 11 show schematic views of a fifth embodiment and a sixth embodiment of the present invention. FIG. 10 of the present invention is an alternation based on FIG. 9, in which two tracks 131 are respectively disposed on diagonal lines of the fluttering slices 120, such that when the electronic device (not shown) is moved in any direction, the ball 132 made of a magnetic material can roll in the track 131, and assists actuating the fluttering slices 120 to swing by magnetic force. FIG. 11 of the present invention is an alternation based on FIG. 5, in which a track 131 surrounding and suspending above the fluttering slices 120 is disposed on the two spanning portions 113, so as to increase the swing frequency of the fluttering slices 120 by the actuation of a ball 132. However, the actuating member 130 of the fifth embodiment and the sixth embodiment of the present invention can also adopt a contact manner to actuate the fluttering slices 120 to swing.

The heat dissipation device of the present invention make the fluttering slices to swing through displacement, such as incline or swing, generated upon operating the electronic device, so as to disturb the air inside the electronic device, and improve the thermal cycling performance, thereby rapidly dissipating the thermal energy generated by the electronic component. Furthermore, the present invention can further has an actuating member to increase the swing frequency of the fluttering slices, so as to achieve better disturbing effect of the air inside the electronic device.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A heat dissipation device, disposed in an electronic device, for performing thermal exchange with an electronic component of the electronic device, comprising:
    a heat sink, with one side attached on the electronic component, for conducting the thermal energy of the electronic component;
    a plurality of fluttering slices, disposed on the heat sink, wherein the fluttering slices are actuated to disturb the air inside the electronic device when the electronic device is moved,
    a combination block, disposed at the other side of the heat sink facing the electronic component, wherein the fluttering slices are arranged around the combination block; two opposite spanning portions extending at periphery of the combination block; and
    an actuating member, wherein the actuating member has a track and at least one ball, wherein the ball rolls in the track to actuate the fluttering slices to swing, and the track is spanned on the two spanning portions.

2. The heat dissipation device as claimed in claim 1, wherein the track is disposed near the fluttering slices, and the fluttering slices have a magnetic material at a position corresponding to the track, the ball is made of a magnetic material, and when the ball rolls in the track, the fluttering slices swing due to the magnetic force of the ball.

3. The heat dissipation device as claimed in claim 2, wherein the magnetic material and the ball have the same polarity.

4. The heat dissipation device as claimed in claim 1, wherein the track is adjacent to the fluttering slices, and the ball rolls in the track and flaps the fluttering slices to swing.

5. The heat dissipation device as claimed in claim 1, wherein a plurality of grooves are disposed on one side of the heat sink facing the fluttering slices.

6. The heat dissipation device as claimed in claim 1, wherein the fluttering slices are arranged on the heat sink at intervals.

* * * * *